United States Patent [19]

Nakada

[11] Patent Number: 4,996,446
[45] Date of Patent: Feb. 26, 1991

[54] SEMICONDUCTOR DEVICE HAVING A REVERSE BIAS VOLTAGE GENERATOR

[75] Inventor: Kazuhiro Nakada, Tokyo, Japan
[73] Assignee: NEC Corporation, Japan
[21] Appl. No.: 413,336
[22] Filed: Sep. 27, 1989

[30] Foreign Application Priority Data

Sep. 27, 1988 [JP] Japan .................................. 63-242724

[51] Int. Cl.$^5$ ...................... H03K 3/01; H03K 17/16; G11C 11/00
[52] U.S. Cl. ............................. 307/296.2; 307/296.5; 307/443
[58] Field of Search ............... 307/296.2, 296.4, 296.5, 307/443, 571, 448; 365/189.09; 323/313

[56] References Cited

U.S. PATENT DOCUMENTS

| | | | |
|---|---|---|---|
| 4,446,384 | 5/1984 | Taira ................................ | 307/296.2 |
| 4,455,628 | 6/1984 | Ozaki et al. ...................... | 307/296.2 |
| 4,571,509 | 2/1986 | Tobita ............................... | 307/443 |
| 4,697,252 | 9/1987 | Furuyama et al. .............. | 365/189.09 |
| 4,920,280 | 4/1990 | Cho et al. ........................ | 307/296.5 |

Primary Examiner—Stanley D. Miller
Assistant Examiner—Y. E. Nguyen

[57] ABSTRACT

An output circuit of a semiconductor circuit has a reverse bias voltage generator which comprises a ring oscillating circuit, a reverse bias voltage generating circuit and a switching circuit. The output circuit is of the type having first and second output N-(P-)channel MOS transistors connected in series, an output terminal being provided at the intermediate position of the transistors. The ring oscillating circuit is activated for oscillation only when an ouptut enabling signal is of a zero potential indicative of disabling outputting of an input data signal. The reverse bias voltage generating circuit generates a reverse bias voltage lower (higher) than the ground potential based on the oscillation output of the oscillating circuit. The switching circuit supplies a reverse bias voltage to the gate of the first output N-(P-)channel MOS transistor only when a bias instruction signal, i.e., a complementary signal of the output enabling signal, is of a positive (negative) potential, whereby the occurrence of ionization current in the first output N-(P-)channel MOS transistor can be effectively prevented even when a negative (positive) voltage is applied to the output terminal.

9 Claims, 2 Drawing Sheets

SEMICONDUCTOR DEVICE HAVING A REVERSE BIAS VOLTAGE GENERATOR

BACKGROUND OF THE INVENTION

The present invention relates to a semiconductor device and, more particularly, to an improvement in a semiconductor integrated circuit with an output circuit, formed on a semiconductor chip provided with a built-in substrate bias circuit.

FIG. 1 illustrates an example of a conventional semiconductor integrated circuit having an output circuit.

The conventional semiconductor integrated circuit having a built-in substrate bias circuit is, as seen in FIG. 1, so arranged that a first gate circuit comprises a NAND circuit $NA_{41}$ and an inverter $IN_{41}$ and a second gate circuit comprises a NAND circuit $NA_{42}$ and an inverter $IN_{42}$.

Further, the output circuit comprises an output N-channel MOS transistor $Q_{41}$ (hereinafter referred to as an N-ch Tr) which is a first output N-channel MOS transistor and an N-ch Tr $Q_{42}$ which is a second output N-channel MOS transistor.

In the NAND circuit $NA_{41}$, one input thereof is supplied with an input data signal DQ and the other input thereof is supplied with an output enabling signal DOE and, in the NAND circuit $NA_{42}$, one input thereof is supplied with a complementary signal $\overline{DQ}$ of the input data signal DQ and the other input thereof is supplied with the output enabling signal DOE.

As for the next inverter $IN_{41}$, it inverts the output of the NAND circuit $NA_{41}$ and is connected to the gate of the N-ch Tr $Q_{41}$ and, as for the inverter $IN_{42}$, it inverts the output of the NAND circuit $NA_{42}$ and is connected to the gate of the N-ch Tr $Q_{42}$.

Further, as for the N-ch Tr $Q_{41}$, its drain is connected to a power source $V_{DD}$ of a positive potential and its source is connected to an output terminal of the output signal $D_{out}$ and, as for the N-ch Tr $Q_{42}$, its drain is connected to the same output terminal of the output signal $D_{out}$ and its source is grounded.

Thus, with respect to the conventional semiconductor integrated circuit as shown in FIG. 1, where the output enabling signal DOE is of a positive potential, the output signal $D_{out}$ of a positive potential is sent out from the output terminal when the input data signal DQ is of a positive potential and the complementary signal $\overline{DQ}$ of the input data signal is of a zero potential whereas the output signal $D_{out}$ of a zero potential is sent out from the output terminal when the input data signal DQ is of a zero potential and the complementary signal $\overline{DQ}$ of the input data signal is of a positive potential.

Further, when the output enabling signal DOE is of a zero potential, the gate potential of each of the N-ch Trs $Q_{41}$, $Q_{42}$ becomes the zero potential which is close to the ground potential so that the N-ch Trs $Q_{41}$, $Q_{42}$ are all in an OFF state and the output terminal does not output any output signal $D_{out}$ and is in a high impedance state.

With the conventional semiconductor circuit as explained above, it may occur that, when the output terminal of the output signal $D_{out}$ is connected to any other external circuits, a voltage close to $-1$ V which is the minimum value as a low level of an input voltage is applied to the output terminal under the high impedance state as mentioned above.

In the conventional semiconductor integrated circuit as shown in FIG. 1, as already explained hereinabove, when the output enabling signal DOE is of a zero potential, the gate potential of each of the N-ch Trs $Q_{41}$, $Q_{42}$ is zero, close to the ground potential. When the potential of the output terminal for the output signal $D_{out}$ assumes a value close to $-1$ V, the threshold voltage $V_{TN}$ (in the order of 0.5–0.9 V) of the N-ch Trs $Q_{41}$, $Q_{42}$ is exceeded to allow the N-ch Trs $Q_{41}$, $Q_{42}$ to be turned to their ON state.

Under the above state, the hole injection in the substrate is caused by the N-ch Trs $Q_{41}$, $Q_{42}$ and, when the capacity of the built-in substrate bias circuit is exceeded, the substrate potential rises so as to cause a malfunction in internal circuits. This phenomenon is known as a malfunction caused by an ionization current.

The magnitude of the ionization current is proportional to the current capacity of a transistor and this becomes maximum when the transistor is in a pinch-off state. Thus, the malfunction by the ionization current becomes worst when a high voltage is present between the drain and the source of the transistor and the gate voltage thereof is in the vicinity of the threshold voltage $V_{TN}$. Further, it is known that the ionization current increases exponentially in accordance with the increase of the voltage between the drain and the source.

In the conventional semiconductor integrated circuit as shown in FIG. 1, there were problems in that, although the ionization current by the N-ch Tr $Q_{42}$ was of a negligible magnitude, that by the N-ch Tr $Q_{41}$ was high thereby causing a malfunction in internal circuits due to the rise of the potential of the substrate.

SUMMARY OF THE INVENTION

Therefore, the main object of the present invention is to provide a semiconductor device in which the occurrence of an ionization current can be prevented even when an abnormal voltage, e.g. a negative voltage (positive voltage) is applied to the output under a high impedance state of the output terminal.

A semiconductor device according to the present invention comprises a first gate circuit, a second gate circuit, a first output MOS transistor and a second output MOS transistor, and a reverse bias voltage generator.

The first gate circuit generates a first internal signal in accordance with an input data signal when an output enabling signal is at its active level data signal only when this output enabling signal is of a positive potential (negative potential), this gate circuit sends a gate signal of a positive potential (negative potential) only when the input data signal is of a positive potential (negative potential) and the output enabling signal is also of a positive potential (negative potential) and sends a gate signal of a zero potential at other times.

On receiving a complementary signal of said input data signal and the output enabling signal, the second gate circuit sends a gate signal of a positive potential (negative potential) only when the complementary signal of the input data signal is of a positive potential (negative potential) and the output enabling signal is also of a positive potential (negative potential) and sends a gate signal of a zero potential at other times.

As to the first output N–(P–)channel MOS transistor, its gate receives the gate signal from the first gate circuit, its drain is connected to a constant-voltage power source of a positive potential (negative potential) and its source is connected to an output terminal. This transistor becomes conductive and outputs an output signal of a positive potential (negative potential) only when the gate signal is of a positive potential (negative potential).

The second output N—(P—)channel MOS transistor has a gate which receives the gate signal from the second gate circuit, a source which is grounded and a drain which is connected to the output terminal. This transistor becomes conductive and outputs an output signal of a zero potential close to the ground potential only when the gate signal is of a positive potential (negative potential).

The reverse bias voltage generator comprises a ring oscillating circuit, a reverse bias voltage generating circuit and a switching circuit.

The ring oscillating circuit is such that, on receiving the complementary signal of the output enabling signal, it is activated and oscillates only when the complementary signal of the output enabling signal indicative of disabling outputting of the input data signal is of a positive potential (negative potential).

The reverse bias voltage generating circuit generates a reverse bias voltage lower (higher) than the ground potential based on the oscillation output of the ring oscillating circuit activated.

The switching circuit is such that, on receiving the complementary signal of the output enabling signal, it supplies the reverse bias voltage from the reverse bias voltage generating circuit to the gate of the first output N-(P-)channel MOS transistor only when the complementary signal of the output enabling signal is of a positive potential (negative potential).

DESCRIPTION OF THE PREFERRED EMBODIMENTS

The embodiments of the present invention are hereinafter explained with reference to the appended drawings.

Figure 1:
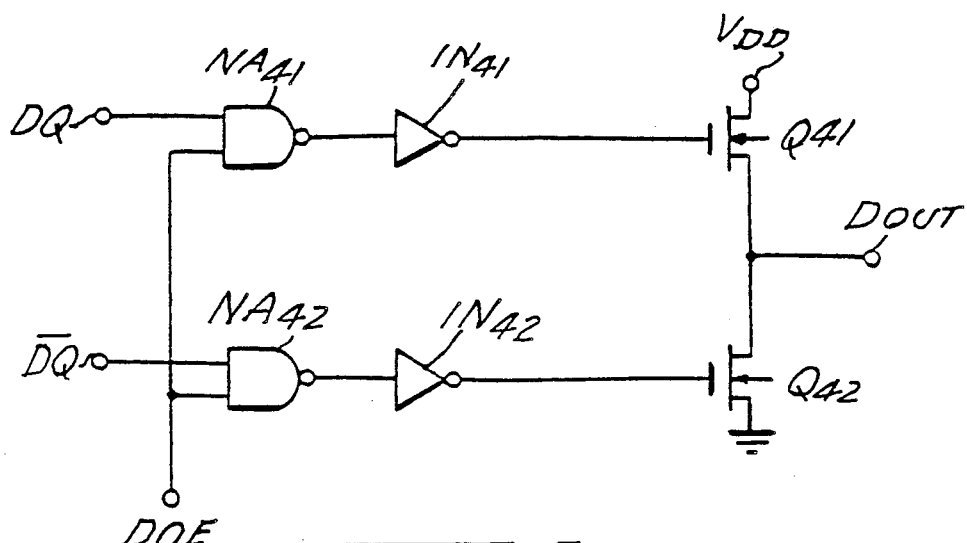
FIG. 1 shows a circuit diagram of an example of a conventional semiconductor integrated circuit having an output circuit.
Figure 2:
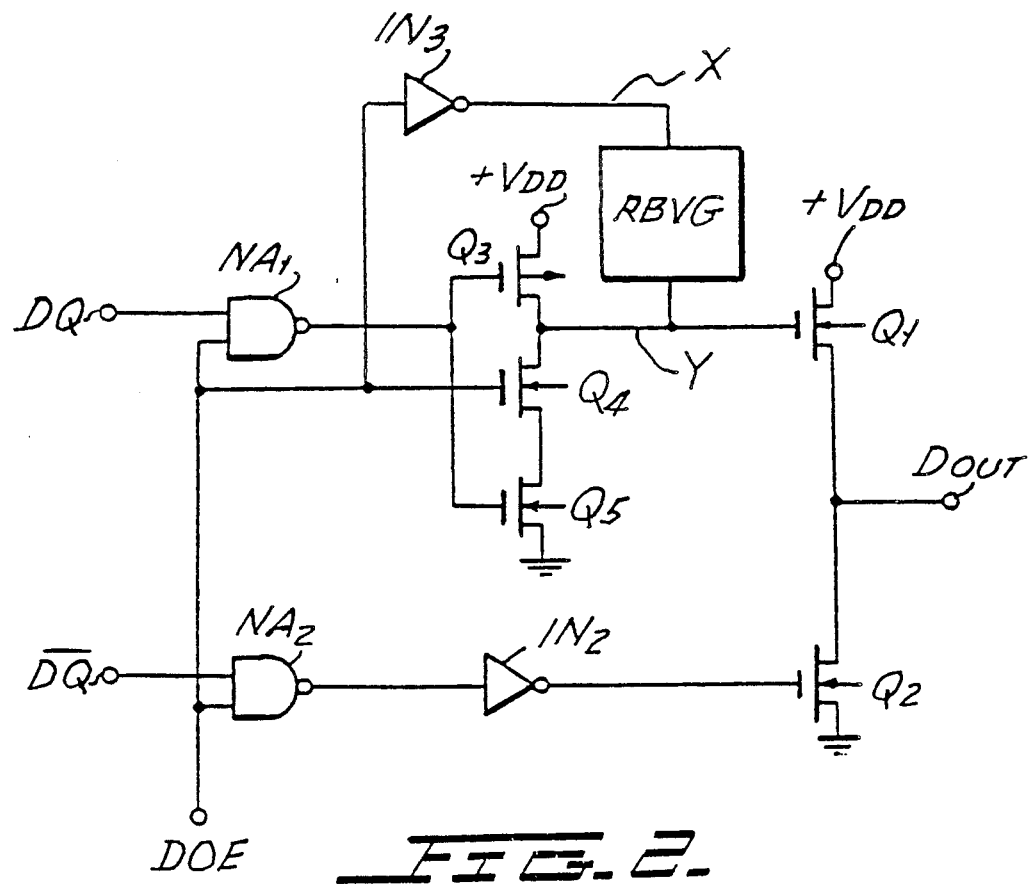
FIG. 2 shows a circuit diagram of a first embodiment of the circuit used in a semiconductor integrated circuit formed on a P-channel semiconductor substrate, according to the present invention.

FIG. 2 shows a circuit diagram of a first embodiment of the circuit used in the semiconductor integrated circuit employing a reverse bias voltage generator according to the present invention.

The circuit of FIG. 2 is formed on a P-type semiconductor substrate and incorporates therein a substrate bias circuit.

First, as shown in FIG. 2, the first gate circuit comprises a NAND circuit $NA_1$, an output P-channel MOS transistor $Q_3$ (hereinafter referred to as, for example, P-ch Tr $Q_3$) and N-ch Trs $Q_4$, $Q_5$ and, the second gate circuit comprises a NAND circuit $NA_2$ and an inverter $IN_2$.

Also, the output circuit comprises an N-ch Tr $Q_1$ as a first output N-channel MOS transistor and an N-ch Tr $Q_2$ as a second output N-channel MOS transistor.

Further, a reverse bias voltage generator RBVG, which inputs a bias instruction signal X inverted by the inverter $IN_3$ in response to the output enabling signal DOE, comprises a ring oscillating circuit, a reverse bias voltage generating circuit and a switching circuit, hereinafter explained in detail.

Figure 3:
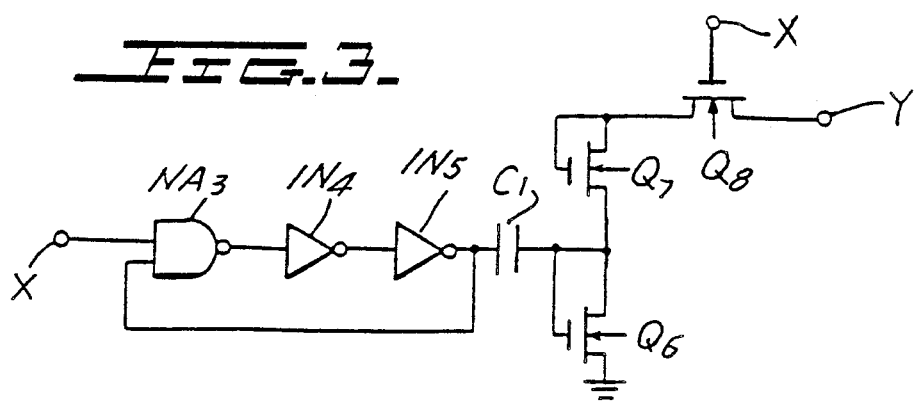
FIG. 3 shows a circuit diagram of the first example of the reverse bias voltage generator.

FIG. 3 shows a circuit diagram of a first example of the reverse bias voltage generator RBVG.

The reverse bias voltage generator RBVG forms, as shown in FIG. 3, a ring oscillating circuit with a NAND circuit $NA_3$ and inverters $IN_4$, $IN_5$, a reverse bias voltage generating circuit with N-ch Trs $Q_6$, $Q_7$ receiving the output of the inverter $IN_5$ through a capacitor $C_1$ and, a switching circuit with an N-ch Tr $Q_8$.

Hereinafter explained with reference to FIGS. 2 and 3 is the function of the circuit of the first example.

One input of the NAND circuit $NA_1$ is supplied with an input data signal DQ being of a positive potential in the presence of data and being of a zero potential in the absence of data and the other input thereof is supplied with an output enabling signal DOE being indicative of enabling outputting of the input data signal DQ only when it is of a positive potential and, one input of the NAND circuit $NA_2$ is supplied with a complementary signal $\overline{DQ}$ of the input data signal and the other input thereof is supplied with the output enabling signal DOE, whereby these NAND circuits send out respective NAND signals.

Next, the P-ch Tr $Q_3$ which receives at its gate a NAND signal from the NAND circuit $NA_1$ has its drain connected to a constant-voltage power source $V_{DD}$ of a positive potential and its source connected to the drain of the N-ch Tr $Q_4$, the gate of the N-ch Tr $Q_1$ and the output of the reverse bias voltage generator RBVG so as to establish a gate signal Y.

The N-ch Tr $Q_4$ which receives at its gate the output enabling signal DOE has its source connected to the drain of the N-ch Tr $Q_5$. The N-ch Tr $Q_5$ which receives at its gate a NAND signal from the NAND circuit $NA_1$ is grounded at its drain.

Consequently, the P-ch Tr $Q_3$ and the N-ch Trs $Q_4$, $Q_5$ send to the gate of the N-ch Tr $Q_1$ a gate signal Y of a positive potential when the input data signal DQ is of a positive potential and also the output enabling signal DOE is of a positive potential and they send a gate signal Y of a zero potential when the input data signal DQ is of a zero potential and the output enabling signal DOE is of a positive potential and, when the output enabling signal DOE is of a zero potential, the P-ch Tr $Q_3$ and the N-ch Tr $Q_4$ are all in an OFF state thereby providing a high impedance state.

Further, the inverter $IN_2$ which inverts the output of the NAND circuit $NA_2$ is connected to the gate of the N-ch Tr $Q_2$. Accordingly, the inverter $IN_2$ sends to the gate of the N-ch Tr $Q_2$ a gate signal of a positive potential only when the complementary signal $\overline{DQ}$ of the input data signal is of a positive potential and also the output enabling signal DOE is of a positive potential and, it sends a gate signal of a zero potential at other times.

On the other hand, the ring oscillating circuit in the reverse bias voltage generator RBVG is so arranged that the NAND circuit $NA_3$, the inverters $IN_4$ and $IN_5$ are connected in series with one input of the NAND circuit $NA_3$ being supplied with the bias instruction signal X and the other input of the same being connected to the output of the inverter IN$_5$. Thus, the ring oscillating circuit is activated for oscillation as a consequence of the bias instruction signal X turning to a positive potential when the output enabling signal DOE is of a zero potential indicative of disabling outputting of the input data signal DQ.

Further, in the N-ch Tr Q$_6$ of the reverse bias voltage generating circuit, the output of the inverter IN$_5$ is coupled to the gate as well as the drain through the capacitor C$_1$ and the source is grounded whereas, in the N-ch Tr Q$_7$, the source is connected to the gate as well as the drain of the N-ch Tr Q$_6$ and the gate and the drain are connected to the source of the N-ch Tr Q$_8$ of the switching circuit so that the oscillating output of the ring oscillating circuit activated causes the generation of a reverse bias voltage lower than the ground potential which resultant reverse bias voltage is forwarded to the source of the N-ch Tr Q$_8$.

Therefore, with the N-ch Tr Q$_8$ of the switching circuit which receives the bias instruction signal X at its gate, the drain supplies to the gate of the N-ch Tr Q$_1$ with the reverse bias voltage from the reverse bias voltage generating circuit as a gate signal Y only when the bias instruction signal X is of a positive potential.

On the assumption that the threshold voltage is V$_{TN}$, when the potential of the gate signal Y becomes more negative than $-V_{TN}$, the N-ch Tr Q$_4$ is turned ON. Thus, by the arrangement wherein the current capacity of the reverse bias voltage generator RBVG is made smaller than that of the N-ch Trs Q$_4$, Q$_5$, the potential of the gate signal Y will be in the order of $-V_{TN}$.

Thus, the N-ch Tr Q$_1$ functions such that, with its drain being connected to the constant-voltage power source V$_{DD}$ of a positive potential and its source being connected to the output terminal, it becomes conductive and outputs the output signal D$_{out}$ of a positive potential only while the gate signal Y is of a positive potential where the input data signal DQ is of a positive potential and the output enabling signal DOE is also of a positive potential.

When the output enabling signal DOE is at a zero potential, the gate of the N-ch Tr Q$_1$ is supplied from the reverse bias voltage generator RBVG a reverse bias voltage, as the gate signal Y, in the order of $-V_{TN}$ which is lower than the ground potential so that, unless a negative voltage greater in the absolute value than a value in the order of $-2V_{TN}$ is applied externally to the output terminal, the N-ch Tr Q$_1$ will not be turned ON.

The threshold voltage V$_{TN}$ is in the order of 0.5-0.9 V and the negative voltage $-2V_{TN}$ is greater in the absolute value or more negative than $-1$ V so that, even when a negative voltage smaller in the absolute value than $-1$ V is applied externally to the output terminal of the output signal D$_{out}$, there is no fear of the occurrence of an ionization current due to the N-ch Tr Q$_1$.

Further, the N-ch Tr Q$_2$ receives at its gate a gate signal sent from the inverter IN$_2$, has its source grounded and has its drain connected to the output terminal so that, only while the gate signal is of a positive potential where the complementary signal $\overline{DQ}$ of the input data signal is of a positive potential and the output enabling signal DOE is also of a positive potential, the N-ch Tr Q$_2$ becomes conductive and outputs the output signal D$_{out}$ of a zero potential close to the ground potential.

Figure 4:
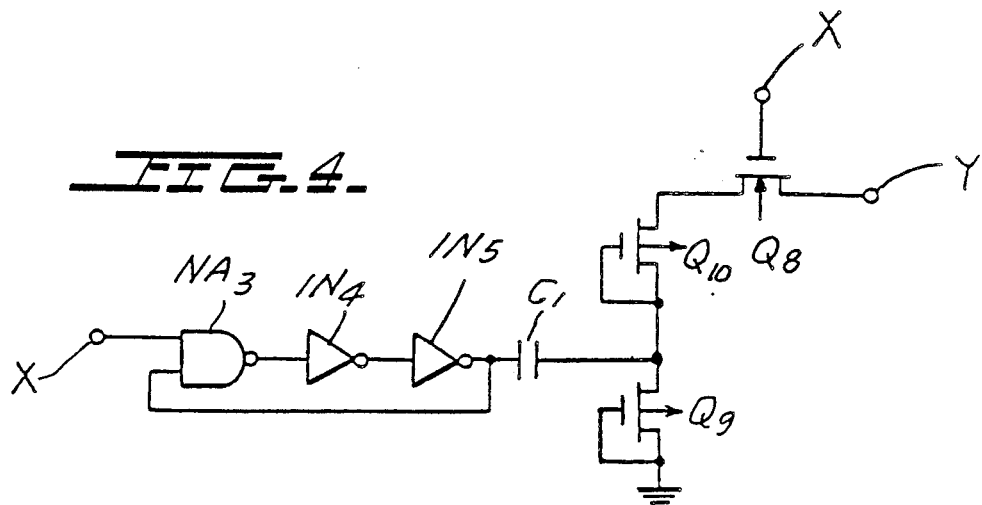
FIG. 4 shows a circuit diagram of the second example of the reverse bias voltage generator.

Next, FIG. 4 shows a circuit diagram of a second embodiment of the reverse bias voltage generator covered by the embodiments of the present invention.

This second embodiment is different from the reverse bias voltage generator of the first example shown in FIG. 3 in the point that, instead of the diode connection of the N-ch Trs Q$_6$, Q$_7$ used in the first example, the diode connection of P-ch Trs Q$_9$, Q$_{10}$ is employed in this second embodiment.

In the second embodiment shown in FIG. 4, since P-ch Trs are used instead of N-ch Trs, it is an advantage that an ionization current due to N-ch Trs can be suppressed.

Figure 5:
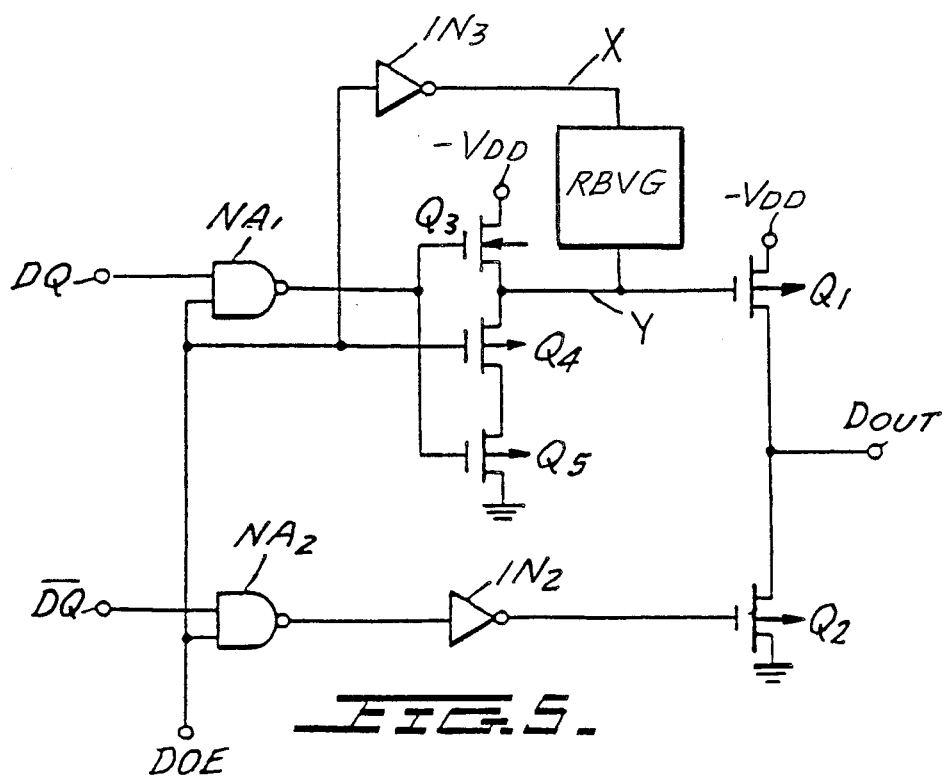
FIG. 5 shows a circuit diagram of a second embodiment of the circuit used in the semiconductor integrated circuit, formed on an N-channel semiconductor substrate.

Although the above explanation is made only with respect to the embodiments and examples wherein circuits are formed all on a P-type semiconductor substrate, it is to be understood that the circuits according to the present invention can be formed similarly on an N-type semiconductor substrate with N-ch Trs and P-ch Trs substituted respectively for each other as shown in FIG. 5.

As described above, in the circuit of the present embodiments and examples, it is so arranged that, in the absence of the output enabling signal, the gate potential of the output N—(P—)channel MOS transist or is caused to be in a positive potential (negative potential) so that no ionization of current can occur even when a negative voltage (positive voltage) is applied to the output terminal.

As explained above, the advantage of the present invention resides in that, when there is no output enabling signal, it is possible for the gate potential of the output N—(P—)channel MOS transistor to be rendered a positive potential (negative potential) whereby the occurrence of ionization current can be effectively prevented even when a negative voltage (positive voltage) is applied to the output terminal.

While the invention has been described in its preferred embodiments, it is to be understood that the words which have been used are words of description rather than limitation and that the changes within the purview of the appended claims may be without departing from the true scope and spirits of the invention its broader aspects.

What is claimed is:

1. An output circuit comprising means for receiving a first input data signal; means for receiving a second input data signal complementary to said first input data signal; means for receiving an output enable signal taking one of first and second logic levels; a first output field effect transistor having a gate and a drain-source current path connected between a power voltage terminal and an output terminal, said power voltage terminal receiving a power voltage of a first polarity; a second output field effect transistor having a gate and a drain-source current path coupled between said output terminal and a reference voltage terminal receiving a reference voltage; a first gate circuit receiving said first input data signal and said output enable signal and having a first control node coupled to a gate of said first transistor, said first control node assuming one of logic levels corresponding to said first input data signal when said output enable signal is at said first level and a high impedance state when said output enable signal is at said second level; a second gate circuit receiving said second input data signal and said output enable signal and having a second control node coupled to a gate of said second transistor, said second control node assuming one of the logic levels corresponding to said second input data signal when said output enable signal is at said first level and an inactive level making said second transistor non-conductive when said output enable signal is at said second level; and a reverse bias voltage generating circuit having a control node receiving said output enable signal and coupled to the gate of said first transistor and a bias output node, said bias output node being set at a bias voltage when said output enable signal is at said second level and at a high impedance state when said output enable signal is at said first level, said bias voltage being of the opposite polarity with respect to that of said power voltage.

2. In an output circuit of a semiconductor integrated circuit having:
- a first gate circuit which, on receiving an input data signal being of a positive potential in the presence of data and being of a zero potential in the absence of data and an output enabling signal being indicative of enabling outputting of said input data signal only when this output enabling signal is at its active level, sends a gate signal only when said input data signal is of a positive potential and said output enabling signal is also of a positive potential and, sends a gate signal of a reference potential at other times;
- a second gate circuit which, on receiving a complementary signal of said input data signal and said output enabling signal, sends a gate signal of a positive potential only when said complementary signal of said input data signal is of a positive potential and said output enabling signal is at said active level and, sends a gate signal of a reference potential at other times;
- a first output MOS transistor in which a gate receives said gate signal from said first gate circuit and having a drain-source current path connected between a power voltage terminal receiving a positive potential and an output terminal, said first transistor being conductive to output an output signal of a positive potential only when said gate signal is of a positive potential; and
- a second output MOS transistor in which a gate receives said gate signal from said second gate circuit, and having a drain-source path connected between a reference voltage terminal and said output terminal, said second transistor being conductive to output an output signal of said reference potential only when said gate signal is of a positive potential;

the improvement comprising:
- a reverse bias voltage generating circuit which generates a reverse bias voltage lower than said reference voltage; and
- a switching circuit which supplies said reverse bias voltage from said reverse bias voltage generating circuit to the gate of said first output MOS transistor only when said output enabling signal is at its inactive level.

3. An output circuit of a semiconductor integrated circuit according to claim 2, wherein said reverse bias voltage generating circuit comprises a ring oscillating circuit having a series circuit of a NAND circuit, a first inverter and a second inverter, one input of said NAND circuit being supplied with a complementary signal of said output enabling signal and the other input of the same being connected to an output of said second inverter.

4. An output circuit of a semiconductor integrated circuit according to claim 2, wherein said reverse bias voltage generating circuit comprises a serial diode connection of two MOS transistors, the source of one of said transistors being grounded and the gate and drain of the same being tied together and coupled to the output of said ring oscillating circuit and also connected to the source of the other transistor, the gate and drain of said other transistor being tied together for outputting said reverse bias voltage.

5. An output circuit of a semiconductor integrated circuit according to claim 2, wherein said switching circuit comprises a MOS transistor, the source thereof being connected to the output of said reverse bias voltage generating circuit, the gate thereof receiving said complementary signal of said output enabling signal and the drain being connected to the gate of said first output MOS transistor.

6. In an output circuit of a semiconductor integrated circuit having:
- a first gate circuit which, on receiving an input data signal being of a negative potential in the presence of data and being of a zero potential in the absence of data and an output enabling signal being indicative of enabling outputting of said input data signal only when this output enabling signal is of a negative potential, sends a gate signal of a negative potential only when said input data signal is of a negative potential and said output enabling signal is also of a negative potential and, sends a gate signal of a zero potential at other times;
- a second gate circuit which, on receiving a complementary signal of said input data signal and said output enabling signal, sends a gate signal of a negative potential only when said complementary signal of said input data signal is of a negative potential and said output enabling signal is also of a negative potential and, sends a gate signal of a zero potential at other times;
- a first output P-channel MOS transistor in which a gate receives said gate signal from said first gate circuit, a drain is connected to a constant-voltage power source of a negative potential and a source is connected to an output terminal and which becomes conductive and outputs an output signal of a negative potential only when said gate signal is of a negative potential; and
- a second output P-channel MOS transistor in which a gate receives said gate signal from said second gate circuit, a source is grounded and a drain is connected to said output terminal and which becomes conductive and outputs an output signal of a zero potential close to the ground potential only when said gate signal is of a negative potential;

said semiconductor integrated circuit having a reverse bias voltage generator and improvement therein comprising:
- a ring oscillating circuit which, on receiving a complementary signal of said output enabling signal, is activated and oscillates only when said complementary signal of said output enabling signal is of a negative potential indicative of disabling outputting of said input data signal;
- a reverse bias voltage generating circuit which generates a reverse bias voltage higher than the ground potential based on the oscillation output of said ring oscillating circuit activated; and a switching circuit which, on receiving said complementary signal of said output enabling signal, supplies said reverse bias voltage from said reverse bias voltage generating circuit to the gate of said first output P-channel MOS transistor only when said complementary signal of said output enabling signal is of a negative potential.

7. An output circuit of a semiconductor integrated circuit according to claim 6, wherein said ring oscillating circuit comprises a series circuit of a NAND circuit, a first inverter and a second inverter, one input of said NAND circuit being supplied with said complementary signal of said output enabling signal and the other input of the same being connected to an output of said second inverter.

8. An output circuit of a semiconductor integrated circuit according to claim 6, wherein said reverse bias voltage generating circuit comprises a serial diode connection of two P-channel MOS transistors, the gate and the source of one of said transistors being grounded and the drain of the same being coupled to the output of said ring oscillating circuit and also connected to the gate and source of the other transistor.

9. An output circuit of a semiconductor integrated circuit according to claim 6, wherein said switching circuit comprises a n-channel MOS transistor, the source thereof being connected to the output of said reverse bias voltage generating circuit, the gate thereof receiving said complementary signal of said output enabling signal and the drain being connected to the gate of said first output P-channel MOS transistor.

* * * * *